US012719462B2

(12) United States Patent
Viswanathan et al.

(10) Patent No.: US 12,719,462 B2
(45) Date of Patent: Aug. 25, 2026

(54) CLOCK STRETCHING CIRCUIT FOR MINIMUM OPERATING VOLTAGE IMPROVEMENT

(71) Applicant: NVIDIA Corp., Santa Clara, CA (US)

(72) Inventors: Kaushik Viswanathan, Austin, TX (US); Daniel Rodriguez, Dublin, CA (US); Tezaswi Raja, San Jose, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 18/922,862

(22) Filed: Oct. 22, 2024

(65) Prior Publication Data

US 2026/0113021 A1 Apr. 23, 2026

(51) Int. Cl.
*H03K 5/125* (2006.01)
*H03K 5/1252* (2006.01)
*H03K 5/133* (2014.01)

(52) U.S. Cl.
CPC .......... *H03K 5/1252* (2013.01); *H03K 5/133* (2013.01)

(58) Field of Classification Search
CPC ...... H03K 5/1252; H03K 5/133; H03K 5/134; H03K 5/14; H03K 5/13; H03K 3/017; H03K 5/04; H03K 5/05; H03K 5/06; H03K 5/065; H03K 7/08; H04L 7/0037; G06F 1/10
See application file for complete search history.

(56) References Cited

U.S. PATENT DOCUMENTS

2006/0181320 A1* 8/2006 Dreps .................. H04L 7/0037
327/175

* cited by examiner

*Primary Examiner* — Jung Kim
(74) *Attorney, Agent, or Firm* — Carnelian Law

(57) ABSTRACT

Circuits for mitigating noise and droop on supply rails that utilize a clock stretcher that includes a chain of adjustable delay elements configured to generate multiple phases of the first clock signal. The circuits are configured to select from among the phases of the first clock signal to form a second clock signal that is a stretched, glitchless form of the first clock signal.

20 Claims, 4 Drawing Sheets

NOISE-AWARE FREQUENCY LOCKED LOOP 108
CLK_IN
variable delay chain 302
thermometer code
404
C0
C1
C2
C(n-2)
C(n-1)
C(n)
D
Q CODE reg
clk
THERMOMETER DECODER 604
CODE dec
+1/-1
01
00
10
11
602
[C(n-2),C(n-1)]

CLOCK STRETCHING CIRCUIT FOR MINIMUM OPERATING VOLTAGE IMPROVEMENT

BACKGROUND

The density and transistor count of advanced integrated circuits (ICs) continues to increase. The higher density and count leads to increased switching activity in these devices and thereby increases current draw and voltage noise on the power supply rails. The increased voltage noise on the power rail may be accounted for in the design margins and added to the operating voltage, thereby increasing the minimum operating voltage (Vmin) of the device. The increased current draw may lead to voltage droop on the supply rails, potentially impairing the operation of the device and also impacting design margins.

To mitigate droop and/or noise on the supply rails and thereby improve Vmin, an IC or package of ICs may be enabled with the capability to programmable throttle the period of the operating clock signal of internal circuits up and down, thereby controlling the switching activity of those circuits. This mechanism may be activated for example in response to a voltage droop on the regulated supply to come of the IC's internal circuits.

Conventional noise-mitigation mechanisms include adaptive clocking with noise-aware frequency-locked loops (noise-aware frequency locked loops) by which the circuit clock responds to high frequency noise on the supply rail with low latency. The utilization of noise-aware frequency locked loops may prevent timing failure and may improve the average operating frequency of the IC. However this mechanism may fail to provide mitigation of voltage droop on the supply rail.

Other conventional noise-mitigation mechanisms may not provide the necessary responsiveness to voltage droop, or may lack the capability to programmatically and/or precisely control the ramp up or down of the operating clock frequency, or they may tend to introduce resonance into IC packages.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Disclosed herein are mechanisms to mitigate switching noise in a regulated supply voltage to clocked circuits while also responding to droop in the supply voltage. The disclosed mechanisms enable low-latency control over switching activity in a circuit in response to a droop (depression) in the regulated supply voltage, thereby reducing the Vmin of circuits in which they are implemented.

Unlike some conventional approaches such as clock-skippers, the disclosed mechanisms may not generate repeating harmonic patterns that excite resonance in an IC package. The disclosed mechanisms may provide a wide programmable range of clock frequency reduction (slow-down) factors. The clock frequency control precision may be higher than with conventional clock dividing and clock skipping mechanisms. The disclosed mechanisms may provide timing-safe and glitch-free generation of a stretched clock signal.

Figure 1:
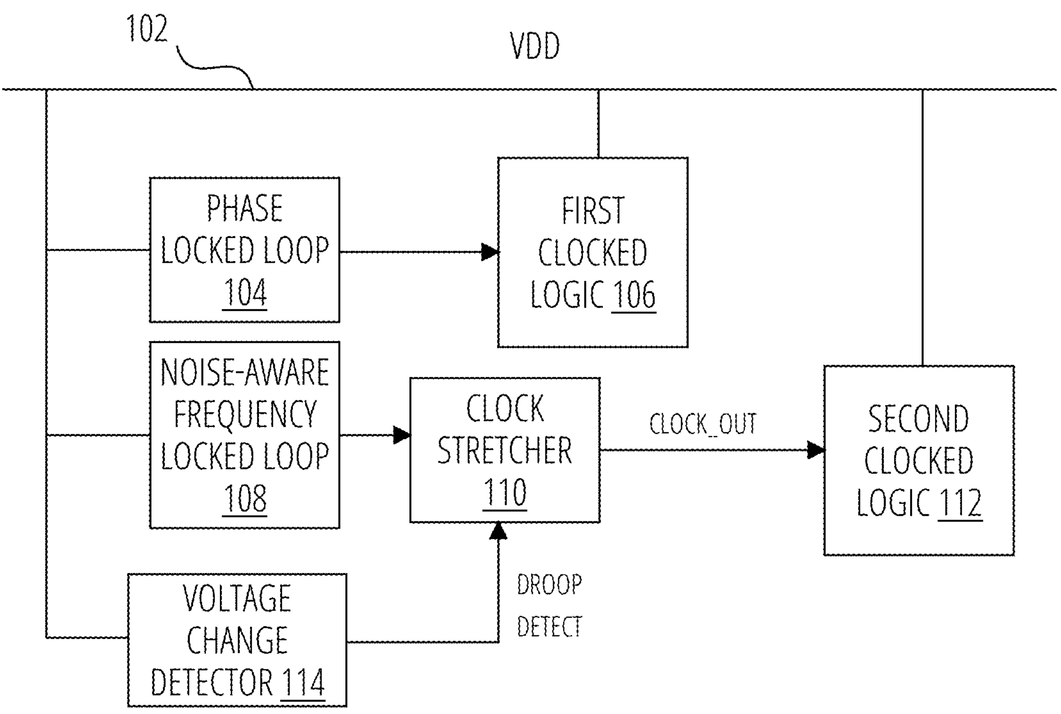
FIG. 1 depicts a system in one embodiment.

FIG. 1 depicts a system in one embodiment. The various depicted components may operate in a regulated supply voltage domain VDD provided to circuits in an IC or package by a supply rail 102.

The system comprises a phase locked loop 104 or other oscillator generating a clock signal to first clocked logic 106, and a second oscillator, for example noise-aware frequency locked loop 108, providing a nominal clock signal that is processed through a clock stretcher 110, resulting in a clock signal to second clocked logic 112. The exemplary phase locked loop 104 and noise-aware frequency locked loop 108 may be implemented in manners known in the art.

In one embodiment the first clocked logic 106 is machine memory logic, e.g., dynamic random access memory (DRAM), and the second clocked logic 112 is level-2 cache logic, e.g., a static random access memory (SRAM).

The system includes a voltage change detector 114 to detect droop on the supply rail 102. The voltage change detector 114 may also be implemented in manners known in the art.

Heavy switching activity in the second clocked logic 112 may generate noise and droop on the supply rail 102. Absent mitigation, this may affect the operation of the first clocked logic 106.

The voltage change detector 114 detects droop on the supply rail 102 arising for example from sudden changes in load current drawn by the second clocked logic 112. In response to a droop the voltage change detector 114 influences the clock stretcher 110 to stretch the nominal clock signal from the noise-aware frequency locked loop 108, thereby reducing switching activity in the second clocked logic 112. This process may take place with low-latency due to the configuration of the clock stretcher 110. The voltage change detector 114 may be triggered to act on the clock stretcher 110 at a configured, programmable droop threshold.

Figure 2:
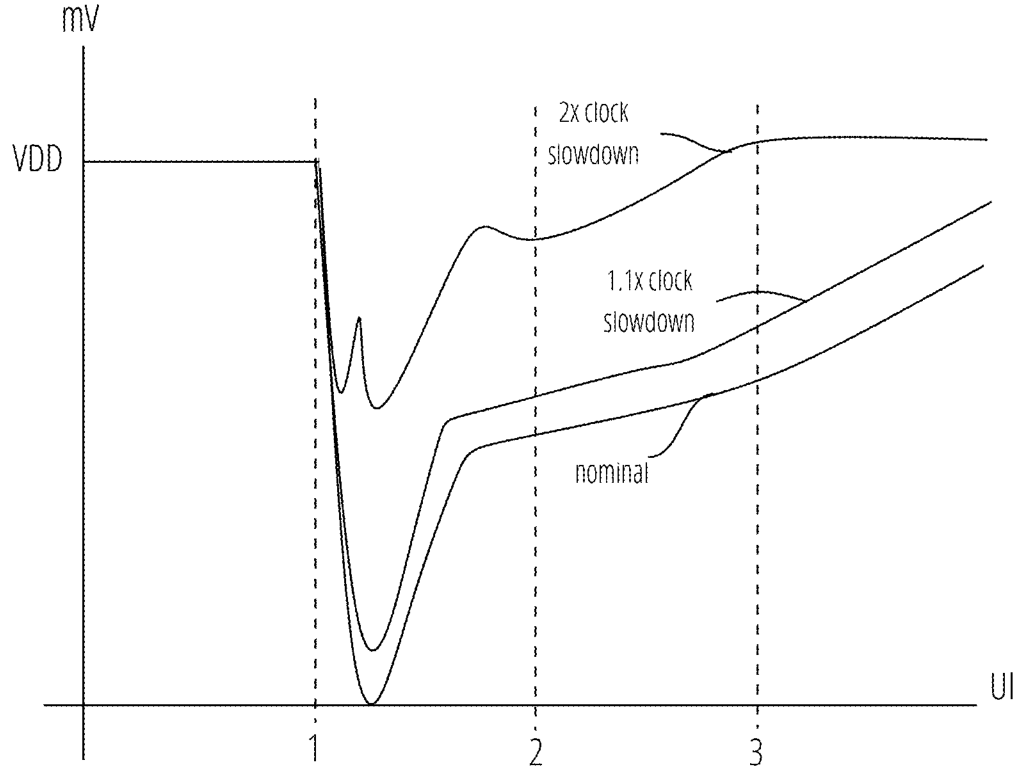
FIG. 2 depicts an example of droop recovery for various clocking scenarios.

FIG. 2 depicts an example of droop recovery for various clocking scenarios. Without utilizing the disclosed mechanisms ("normal" scenario), the extent of the droop is most severe, and recovery to nominal operating voltage VDD does not occur until more than four unit intervals (e.g., clock periods). Stretching the clock period by 1.1× results in somewhat less severe droop and a somewhat faster recovery to VDD. Stretching the clock period by 2× results in less than half the normal droop and a recovery to VDD at three unit intervals, a substantial improvement.

Figure 3:
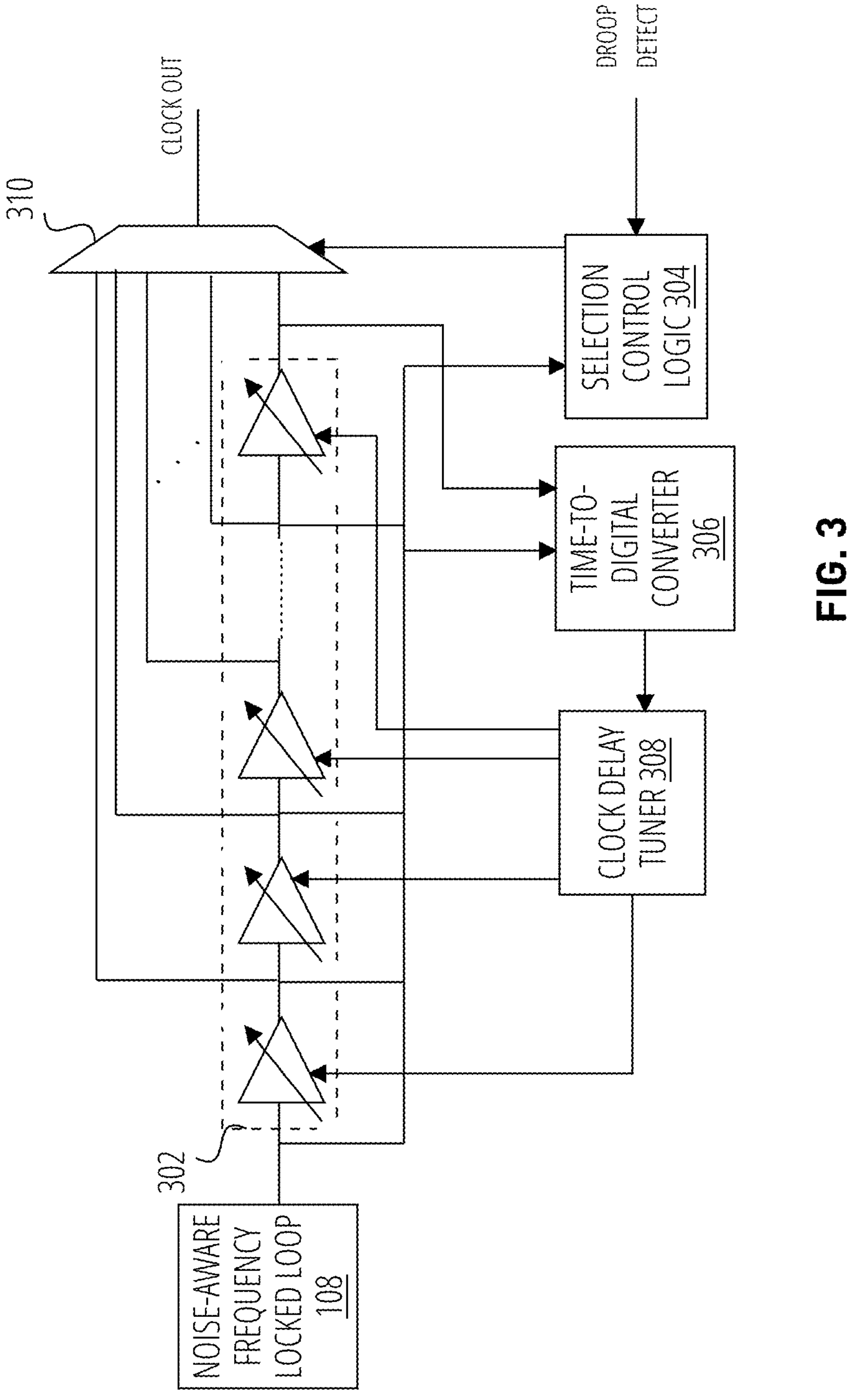
FIG. 3 depicts additional aspects of a clock stretcher circuit in one embodiment.

FIG. 3 depicts additional details of a clock stretcher 110 in one embodiment. The clock stretcher 110 comprises a variable delay chain 302 configured to receive the nominal clock signal from the noise-aware frequency locked loop 108. The selection control logic 304 (e.g., a finite state machine), a time-to-digital converter 306, and a clock delay tuner 308 cooperate to tune the delay elements in the variable delay chain 302 and operate a multiplexer 310 to select a stretched, timing-safe output clock to downstream logic, e.g., second clocked logic 112 in FIG. 1. The adjustable delay elements of the variable delay chain 302 may be implemented in manners known in the art.

The time-to-digital converter 306 taps the nominal input clock signal and the clock phases generated within the variable delay chain 302 and generates a thermometer code representation thereof. The thermometer code is converted into tuning signals to the adjustable delay elements of the variable delay chain 302.

Figure 4:
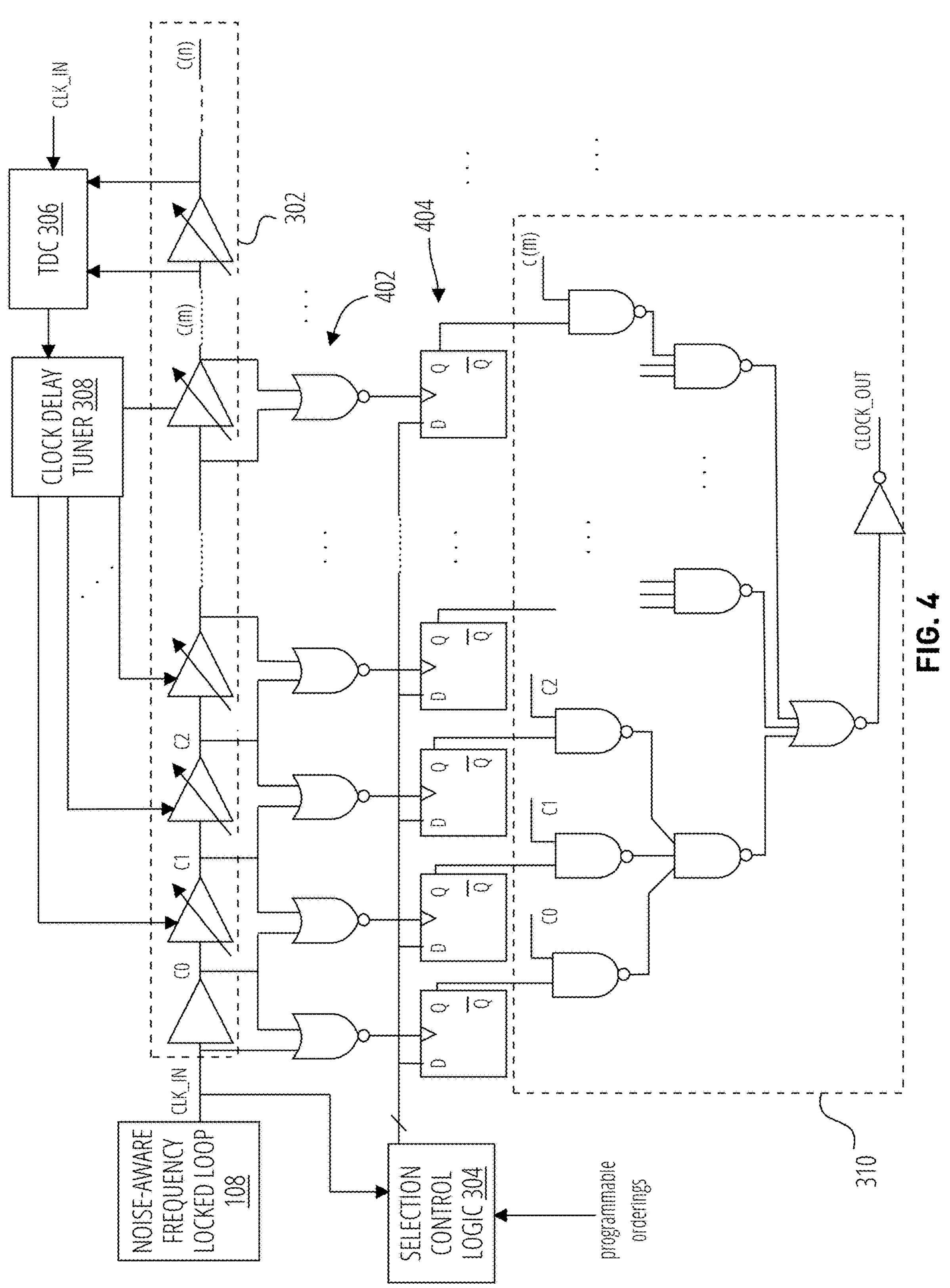
FIG. 4 depicts additional aspects of a clock stretcher circuit in one embodiment.

FIG. 4 depicts additional aspects of a clock stretcher 110 circuit in one embodiment. The components of the clock stretcher 110 cooperate to stretch each cycle of the nominal input clock from the noise-aware frequency locked loop 108 by a programmable amount of time. In the depicted embodiment, the low portion of the nominal input clock is stretched while ensuring the high portion is maintained at the same width as the high portion of the nominal clock (i.e., ensuring no glitch at the output of the multiplexer 310). Other implementations may extend the low and high portions of the nominal clock proportionally to maintain a 50% duty cycle of the stretched clock.

A glitch is a pulse shorter than the width of portion of the nominal clock signal utilized for clocking, e.g., shorter than the high-polarity portion of the nominal clock signal. Glitching is problematic to circuit operation due to the potential for violating timing margins of the downstream clocked circuits. The clock stretcher 110 utilizes sampling elements 402 (e.g., NOR gates) disposed across the adjustable delay elements to sample adjacent clock phases and generate clock signals to a flop bank 404 (that may comprise latches or other clocked storage circuits) to help ensure the multiplexer 310 output switches in a glitchless fashion (e.g., only during the low portion of the clock phases).

In the depicted example, the multiplexer 310 is implemented as an AOI tree, although other mux designs may also be used. The multiplexer 310 responds to the selection signal by switching its output to be one of the clock phases (c0, c1, c2, etc.) generated by the variable delay chain 302. The selection control logic 304 (e.g., a finite state machine) generates a one-hot control code to the flop banks that orders the selected clock phases to achieve a desired stretching of the output clock signal. The sampling elements 402 ensure the output of the multiplexer 310 switches without glitching, thereby providing a safe-timing window for clocked downstream logic.

The selection control logic 304 may be configured with selection orderings to effectuate different clock stretching extents corresponding to different levels of droop and/or noise on the supply rail 102. These orderings may vary according to the particular chip or package or other implementation details. The orderings may be determined empirically via profiling of the chip or package and configured as firmware or hardware settings, or may be set programmatically during device operation by power management or noise-reduction logic that is commonly utilized in electronic devices. The orderings may be configured to avoid conditions that excite resonance in the larger system, e.g., a chip package.

Figures 5, 6:
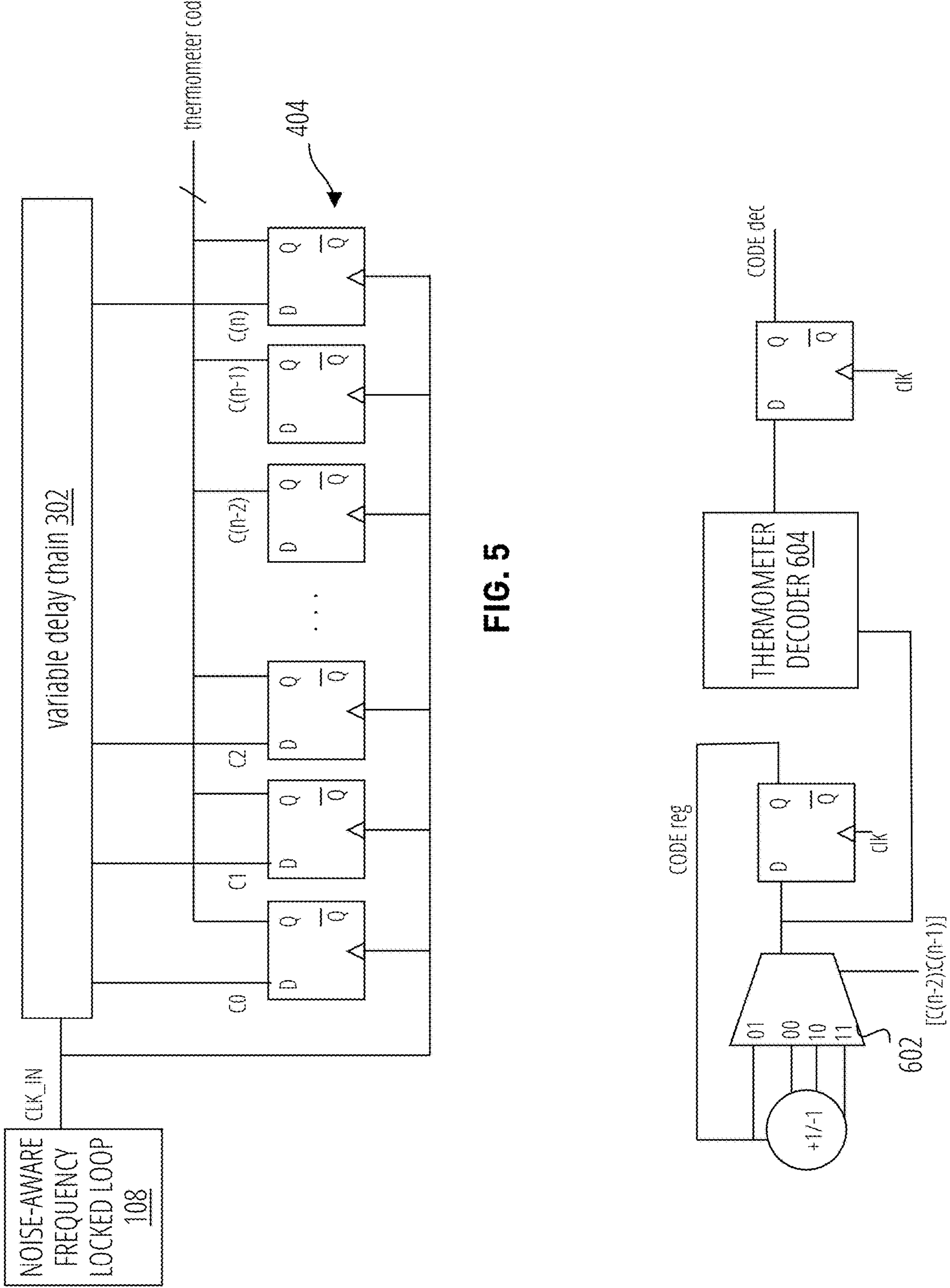
FIG. 5 depicts an exemplary thermometer code generating time-to-digital converter embodiment.
FIG. 6 depicts clock delay control logic in one embodiment.

The time-to-digital converter 306 inputs the nominal clock signal from the noise-aware frequency locked loop 108 and also samples the currently-configured delay of the adjustable delay elements in the variable delay chain 302. Based on these inputs the time-to-digital converter 306 generates a control code, e.g., a thermometer code, to the clock delay tuner 308, which responds by tuning the delays of one or more of the adjustable delay elements. An exemplary thermometer code generating time-to-digital converter 306 embodiment is depicted in FIG. 5. This maintains the overall phase shift of the clock phases to within one period of the nominal clock as operation conditions (e.g., ambient temperature, clock frequency, or operating voltage) vary.

FIG. 6 depicts clock delay tuner 308 logic in one embodiment. The clock delay tuner 308 utilizes samples from the variable delay chain 302 of the time-to-digital converter 306 as a selection code to a step selector 602. The selected step is applied to a thermometer decoder 604 to update the thermometer code (CODE_dec) utilized to tune the stages of the variable delay chain 302.

LISTING OF DRAWING ELEMENTS

102 supply rail
104 phase locked loop
106 first clocked logic
108 noise-aware frequency locked loop
110 clock stretcher
112 second clocked logic
114 voltage change detector
302 variable delay chain
304 selection control logic
306 time-to-digital converter
308 clock delay tuner
310 multiplexer
402 sampling element
404 flop bank
602 Step Selector
604 Thermometer Decoder Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Logic symbols in the drawings should be understood to have their ordinary interpretation in the art in terms of functionality and various structures that may be utilized for their implementation, unless otherwise indicated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

Although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the intended invention as claimed. The scope of inventive subject matter is not limited to the depicted embodiments but is rather set forth in the following Claims.

What is claimed is:

1. A clock stretching circuit comprising:

a chain of adjustable delay elements configured to generate a plurality of phases of an input clock signal; and a logic circuit configured to select from among the plurality of phases of the input clock signal to form an output clock signal that is a stretched, glitchless form of the input clock signal.

2. The clock stretching circuit of claim 1, the logic circuit further configured to select from among the plurality of phases of the input clock signal based on an amount of voltage droop on a supply rail of the circuit.

3. The clock stretching circuit of claim 2, wherein the logic circuit is further configured to select the phases in an order corresponding to an extent of stretch to generate in the output clock signal.

4. The clock stretching circuit of claim 1, the logic circuit further configured to automatically tune the adjustable delay elements in response to changes in voltage on a supply rail of the circuit.

5. The clock stretching circuit of claim 4, the logic circuit further configured to automatically tune the adjustable delay elements comprises a thermometer code generator.

6. The clock stretching circuit of claim 5, wherein the thermometer code generator is configured to transform the input clock signal and the phases of the input clock signal into a thermometer code.

7. The clock stretching circuit of claim 5, the logic circuit further configured to convert a thermometer code from the thermometer code generator into tuning signals to the adjustable delay elements.

8. The clock stretching circuit of claim 1, wherein the logic circuit comprises:

a flop bank; and sampling elements disposed across the adjustable delay elements and configured to clock the flop bank.

9. The clock stretching circuit of claim 8, wherein the flop bank is configured to input selections from among the plurality of phases of the input clock signal.

10. The clock stretching circuit of claim 9, further comprising a multiplexer configured to receive outputs of the flop bank.

11. A circuit comprising:

a voltage change detector configured to detect change in a supply voltage to clocked circuitry;

a chain of adjustable delay elements configured to generate a plurality of phases of an input clock signal; and a logic circuit configured to select from among the plurality of phases of the input clock signal to stretch the input clock signal to form an output clock signal that is a stretched, glitchless form of the input clock signal based on an amount of the changes in the supply voltage.

12. The circuit of claim 11, wherein the logic circuit is configured to select from among the plurality of phases of the input clock signal in an order corresponding to an extent of stretch to generate in the output clock signal.

13. The circuit of claim 11, the logic circuit further configured to automatically tune the adjustable delay elements in response to the changes in the supply voltage.

14. The circuit of claim 13, further comprising a thermometer code generator.

15. The circuit of claim 14, wherein the thermometer code generator is configured to transform the input clock signal and the phases of the input clock signal into a thermometer code.

16. The circuit of claim 14, further configured to convert a thermometer code from the thermometer code generator into tuning signals to the adjustable delay elements.

17. The circuit of claim 11, wherein the logic circuit comprises:

a flop bank; and sampling elements disposed across the adjustable delay elements and configured to clock the flop bank.

18. The circuit of claim 17, wherein the flop bank is configured to input selections from among the plurality of phases of the input clock signal.

19. The circuit of claim 18, further comprising a multiplexer configured to receive outputs of the flop bank.

20. A system comprising:

a dynamic random access memory (DRAM);

a static random access memory (SRAM); and a chain of adjustable delay elements configured to generate a plurality of phases of an input clock signal; and a logic circuit configured to select from among the plurality of phases of the input clock signal to stretch the input clock signal to form an output clock signal that is a stretched, glitchless form of the input clock signal applied to the SRAM based on a detected change to a supply voltage to the DRAM.

* * * * *